US012610607B2

(12) United States Patent
Yoshida

(10) Patent No.: US 12,610,607 B2
(45) Date of Patent: Apr. 21, 2026

(54) METHOD OF MANUFACTURING SEMICONDUCTOR DEVICE

(71) Applicant: Powerchip Semiconductor Manufacturing Corporation, Hsinchu (TW)

(72) Inventor: Hiroshi Yoshida, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 882 days.

(21) Appl. No.: 17/858,036

(22) Filed: Jul. 5, 2022

(65) Prior Publication Data

US 2023/0230883 A1 Jul. 20, 2023

(30) Foreign Application Priority Data

Jan. 3, 2022 (TW) .................................. 111100019

(51) Int. Cl.
*H10D 84/01* (2026.01)
*H10D 64/01* (2025.01)
(Continued)

(52) U.S. Cl.
CPC ......... *H10D 84/038* (2025.01); *H10D 64/017* (2025.01); *H10D 84/0144* (2025.01); *H10D 84/0151* (2025.01); *H10P 14/6308* (2026.01); *H10P 50/242* (2026.01); *H10P 50/692* (2026.01); *H10P 52/403* (2026.01); *H10P 76/405* (2026.01); *H10P 95/062* (2026.01)

(58) Field of Classification Search
None
See application file for complete search history.

(56) References Cited

U.S. PATENT DOCUMENTS 6,346,445 B1 * 2/2002 Hsu .................... H10D 84/0144
257/E21.549
7,273,787 B2 9/2007 Chen et al.
(Continued)

FOREIGN PATENT DOCUMENTS

TW 200532860 10/2005
WO 2012035731 3/2012

OTHER PUBLICATIONS

"Notice of Allowance of Taiwan Counterpart Application," issued on Feb. 22, 2023, p. 1-p. 7.

*Primary Examiner* — Jeff W Natalini
*Assistant Examiner* — Jacob Raul Marin
(74) *Attorney, Agent, or Firm* — JCIPRNET

(57) ABSTRACT

A method of manufacturing a semiconductor device includes forming a gate oxide layer on a substrate, where the substrate includes a high voltage region and a low voltage region. The gate oxide layer is disposed in the high voltage region. Wet etching is performed on the gate oxide layer to reduce a thickness of the gate oxide layer. Multiple trenches are formed around the high voltage region in the substrate, where forming the trenches includes removing an edge of the gate oxide layer to make the thickness of the gate oxide layer uniform. An insulating material is filled in the trenches to form multiple shallow trench isolation structures, where an upper surface of the shallow trench isolation structures close to the edge of the gate oxide layer is coplanar with an upper surface of the gate oxide layer.

7 Claims, 13 Drawing Sheets

(51) Int. Cl.
  *H10D 84/03*   (2025.01)
  *H10P 14/60*   (2026.01)
  *H10P 50/00*   (2026.01)
  *H10P 50/24*   (2026.01)
  *H10P 52/40*   (2026.01)
  *H10P 76/40*   (2026.01)
  *H10P 95/00*   (2026.01)

(56)     References Cited

U.S. PATENT DOCUMENTS

| | | |
|---|---|---|
| 7,348,256 B2 | 3/2008 | Miller, Jr. et al. |
| 9,716,139 B2 | 7/2017 | Chen et al. |
| 2001/0016426 A1* | 8/2001 | Lee ................... H01L 21/02186 |
| | | 257/E21.232 |
| 2009/0159966 A1* | 6/2009 | Huang ................. H10D 84/038 |
| | | 257/334 |
| 2009/0273029 A1 | 11/2009 | Tien et al. |
| 2010/0006937 A1 | 1/2010 | Lee |
| 2013/0234244 A1 | 9/2013 | Liu |
| 2015/0069524 A1* | 3/2015 | Hong ................... H10D 86/201 |
| | | 438/587 |
| 2020/0144279 A1 | 5/2020 | Chuang et al. |
| 2021/0118875 A1* | 4/2021 | Wu .................... H10D 84/0151 |
| 2021/0313316 A1* | 10/2021 | Huang .............. H10D 30/0281 |
| 2021/0343704 A1* | 11/2021 | Lin ..................... H10D 62/116 |

* cited by examiner

METHOD OF MANUFACTURING SEMICONDUCTOR DEVICE

CROSS-REFERENCE TO RELATED APPLICATION

This application claims the priority benefit of Taiwan application serial no. 111100019, filed on Jan. 3, 2022. The entirety of the above-mentioned patent application is hereby incorporated by reference herein and made a part of this specification.

BACKGROUND

Technical Field

The disclosure relates to a semiconductor technology, and in particular to a method of manufacturing a semiconductor device.

Description of Related Art

In an integrated circuit design, low-voltage logic circuits generally require high-voltage components at their interfaces to convert the required voltage to various electronic devices. Therefore, if the low-voltage and high-voltage components are manufactured in a compatible process, the manufacturing cost can be significantly reduced.

Moreover, with the increasing integration of components, the gate-last process has been developed to replace polysilicon gates with metal gates to solve the electrical problems caused by the reduction of gate size.

However, in the gate-last process with the high dielectric constant dielectric layer/metal gate (High-K Metal Gate, HKMG), when the semiconductor device integrates low-voltage and high-voltage components with different operating voltages, the thickness of the gate oxide layer of different components is different, and in order to replace the temporary polysilicon gate with a metal gate in the gate-last process, the gate height of some components is sacrificed in the planarization process, resulting in poor stability of the semiconductor device.

In addition, the gate oxide layer in high voltage components is thick and therefore requires a longer thermal oxidation process. However, because the active region of the component is generally predefined by the shallow trench isolation (STI) structure, the existence of the STI structure leads to insufficient sources of silicon, and the thickness of the gate oxide layer adjacent to the STI structure decreases, resulting in time dependent dielectric breakdown (TDDB) and damage.

SUMMARY

The disclosure provides a method of manufacturing a semiconductor device, capable of integrating existing processes without complicated steps to manufacture a semiconductor device with no height difference between metal gate layers of a high voltage region and a low voltage region and no time dependent dielectric breakdown phenomenon.

The method of manufacturing the semiconductor device of the disclosure includes the following. A gate oxide layer is formed on a substrate, where the substrate includes a high voltage region and a low voltage region, and the gate oxide layer is disposed in the high voltage region. Wet etching is performed on the gate oxide layer to reduce a thickness of the gate oxide layer. Then, plural trenches are formed around the high voltage region in the substrate, where forming the trenches includes removing an edge of the gate oxide layer to make the thickness of the gate oxide layer uniform. An insulating material is filled in the trenches to form plural shallow trench isolation structures, where an upper surface of the shallow trench isolation structures close to the edge of the gate oxide layer is coplanar with an upper surface of the gate oxide layer. A gate dielectric layer is formed in the low voltage region on the substrate, where an upper surface of the gate dielectric layer is coplanar with the upper surface of the gate oxide layer in the high voltage region.

According to one embodiment of the disclosure, the method for forming the gate oxide layer includes that a first mask layer is first formed on a substrate, the first mask layer is patterned to expose a portion of the substrate, a portion of the substrate is partially oxidized to form the gate oxide layer, and then the first mask layer is removed.

According to one embodiment of the disclosure, the method for forming the first mask layer includes that a silicon dioxide layer is formed on the substrate, and then a silicon nitride layer is formed on the silicon dioxide layer.

According to one embodiment of the disclosure, the method of forming the trenches includes that a second mask layer is formed on the substrate and the gate oxide layer, then the second mask layer is patterned to expose a portion of the substrate and the edge of the gate oxide layer, and dry etching is performed to form the trenches.

According to one embodiment of the disclosure, the method for forming the shallow trench isolation structures may further include that after filling the insulating material, a chemical mechanical planarization process is performed on the insulating material.

According to one embodiment of the disclosure, the method of manufacturing the semiconductor device may further include that a first metal gate layer and a second metal gate layer are respectively formed on the upper surface of the gate oxide layer and the upper surface of the gate dielectric layer.

According to one embodiment of the disclosure, the method for forming the first metal gate layer and the second metal gate layer includes the following. A sacrificial gate layer is formed at a predetermined position of the gate oxide layer and the gate dielectric layer. A dielectric layer is formed on the substrate to cover the sacrificial gate layer. A first chemical mechanical planarization process is performed on the dielectric layer until the sacrificial gate layer is exposed. The sacrificial gate layer is removed. Then, a metal layer is formed on the substrate to fill the predetermined position within the dielectric layer, and a second chemical mechanical planarization process is performed on the metal layer to form the first metal gate layer and the second metal gate layer.

Based on the above, the method of manufacturing the semiconductor device of the disclosure is improved by the process of completing the gate oxide layer and reducing the thickness thereof slightly before digging the trench to form the shallow trench isolation structure. Since the process of digging the trench removes the edges of the gate oxide layer with varying thickness, the overall thickness of the gate oxide layer may be made uniform to avoid time dependent dielectric breakdown (TDDB) phenomenon. In addition, the modification of the manufacturing method according to the disclosure may also ensure the same thickness of the metal gate layer in the high voltage region and the low voltage region to improve the stability of the semiconductor device.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
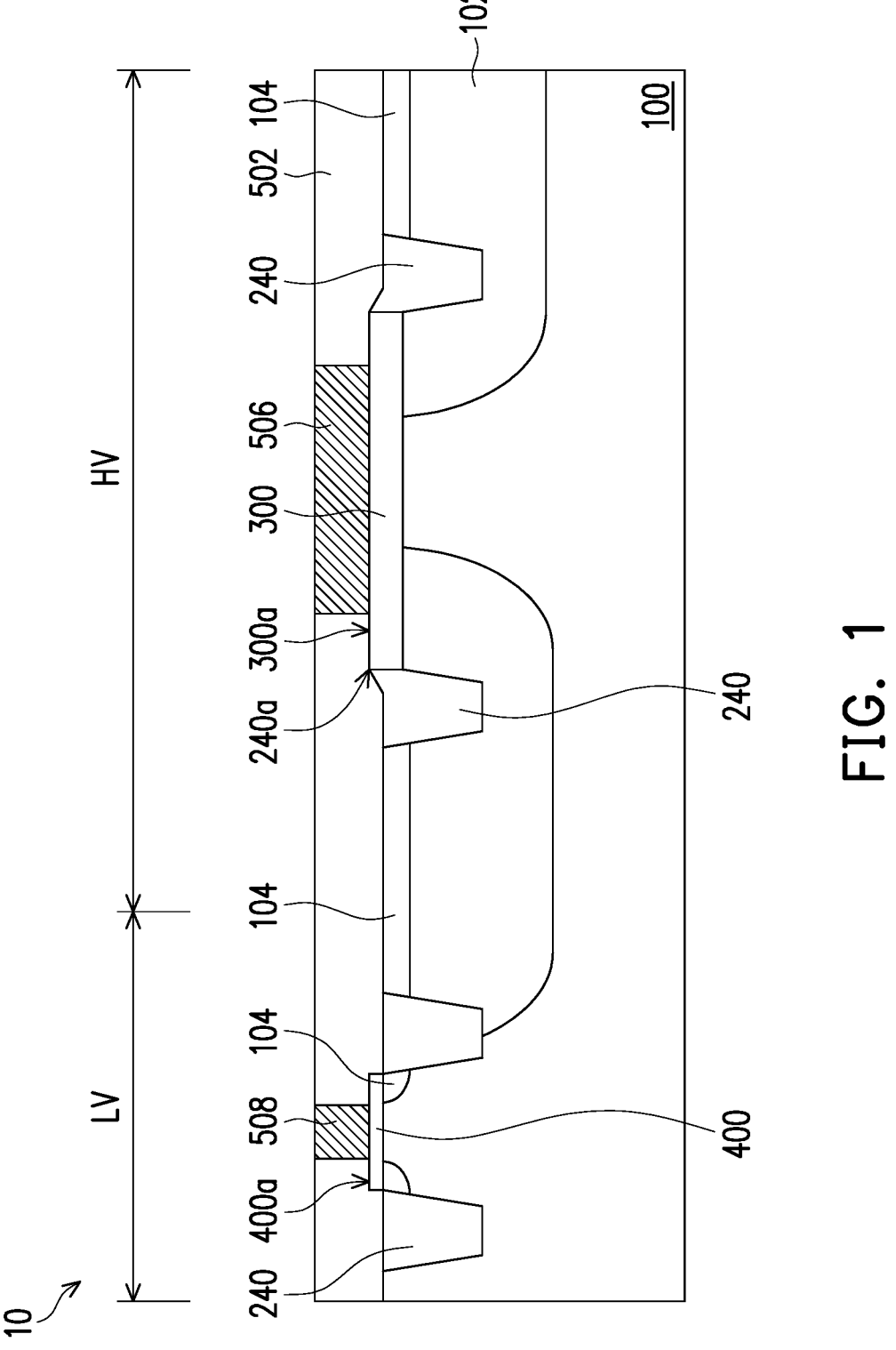
FIG. 1 is a schematic cross-sectional view of a semiconductor device according to a first embodiment of the disclosure.

The following provides a number of different implementations or embodiments for implementing different features of the disclosure. Moreover, these embodiments are merely exemplary and are not intended to limit the scope and application of the disclosure. Furthermore, the relative dimensions (e.g., length, thickness, spacing, etc.) and relative positions of each region or structural element may be reduced or enlarged for the sake of clarity. Additionally, the use of similar or identical reference numerals in each figure indicates similar or identical elements or features.

FIG. 1 is a schematic cross-sectional view of a semiconductor device according to a first embodiment of the disclosure.

Referring to FIG. 1, a semiconductor device 10 according to the first embodiment includes a substrate 100, a gate oxide layer 300, a gate dielectric layer 400, plural shallow trench isolation structures 240, a first metal gate layer 506 and a second metal gate layer 508. The substrate 100 includes a high voltage region HV and a low voltage region LV, and the shallow trench isolation structure 240 in the substrate 100 is used to define an active region in the high voltage region HV and the low voltage region LV of the semiconductor device 10. The gate oxide layer 300 is disposed in the high voltage region HV, and a thickness of a center of the gate oxide layer 300 is consistent with a thickness of an edge of the gate oxide layer 300. In detail, the gate oxide layer 300 is formed in the active region of the high voltage region HV, so the gate oxide layer 300 is surrounded by the shallow trench isolation structures 240, and the thickness of the center of the gate oxide layer 300 is substantially the same as a thickness near the shallow trench isolation structure 240. The gate dielectric layer 400 is disposed in the low voltage region LV, and an upper surface 400a of the gate dielectric layer 400 is coplanar with an upper surface 300a of the gate oxide layer 300. Although the shallow trench isolation structures 240 are shown on both sides of the gate oxide layer 300 and on both sides of the gate dielectric layer 400 in FIG. 1, when viewed from above, the shallow trench isolation structures 240 surround the gate oxide layer 300 and the gate dielectric layer 400. The first metal gate layer 506 is located on the gate oxide layer 300 as a gate structure of the high voltage region HV, and the second metal gate layer 508 is located on the gate dielectric layer 400 as a gate structure of the low voltage region LV. The first metal gate layer 506 and the second metal gate layer 508 may be formed in a dielectric layer 502 using a gate-last process with a high dielectric constant dielectric layer/metal gate (HKMG). Therefore, the gate dielectric layer 400 is a high dielectric constant material such as hafnium dioxide ($HfO_2$), titanium dioxide ($TiO_2$), zirconium dioxide ($ZrO_2$), tantalum oxide ($Ta_2O_5$) or aluminum oxide ($Al_2O_3$), but the disclosure does not limited thereto. According to this embodiment, the gate oxide layer 300 may be a thermal oxide layer formed by thermal oxidation. According to this embodiment, the semiconductor device 10 may further include multiple lightly-doped drain regions 102 located in the substrate 100 on opposite sides of the first metal gate layer 506. An upper surface 240a of the shallow trench isolation structure 240 close to the edge of the gate oxide layer 300 is coplanar with the upper surface 300a of the gate oxide layer 300. According to the this embodiment, the semiconductor device 10 may further include plural source/drain regions 104 located on opposite sides of the gate dielectric layer 400, but the disclosure is not limited thereto. The source/drain regions 104 may also be located in the lightly-doped drain region 102 in the high voltage region HV, and have a higher doping concentration compared to the lightly-doped drain region 102.

FIG. 2 to FIG. 13 are schematic cross-sectional views of the manufacturing process of a semiconductor device according to a second embodiment of the disclosure.

Figure 2:
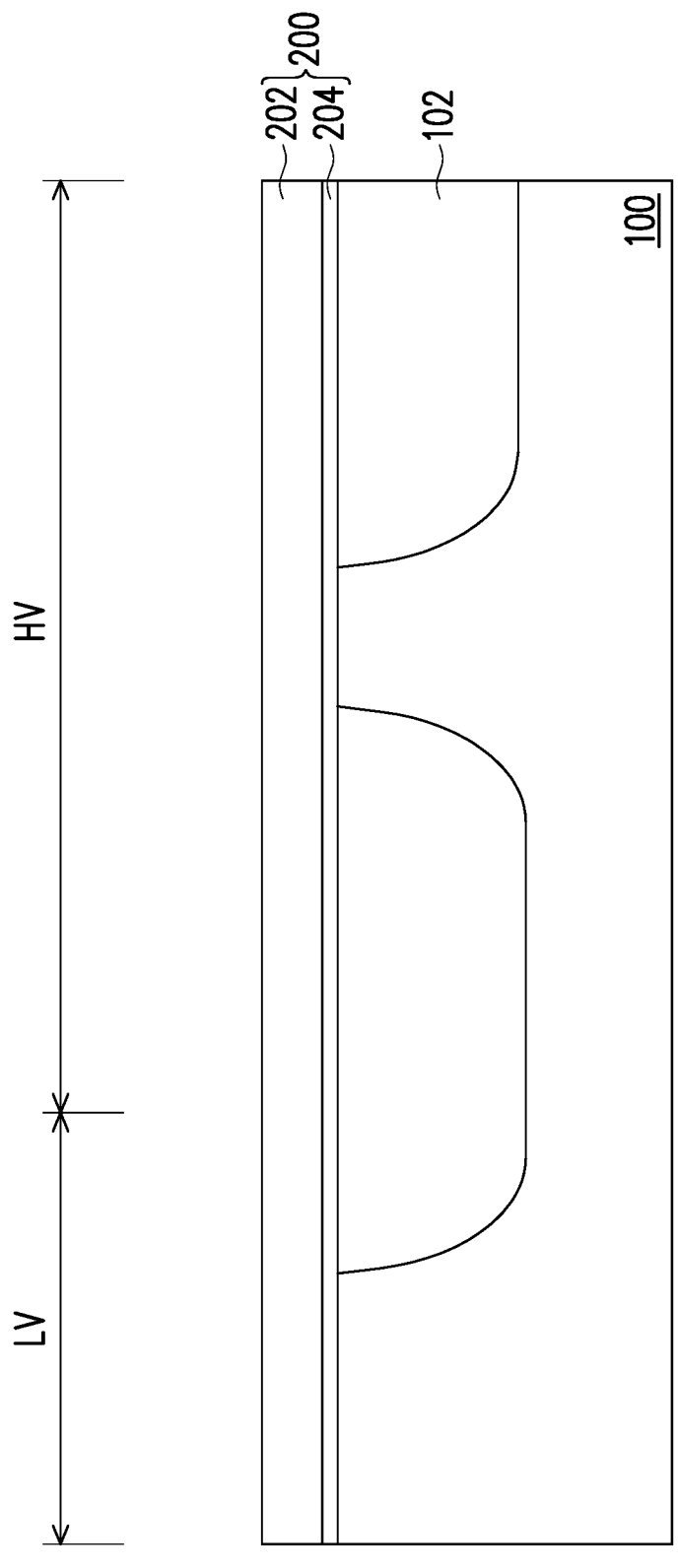
FIG. 2 to FIG. 13 are schematic cross-sectional views of the manufacturing process of a semiconductor device according to a second embodiment of the disclosure.

Referring to FIG. 2 first, a substrate 100 is provided with a high voltage region HV and a low voltage region LV according to the circuit design. According to this embodiment, plural lightly-doped drain regions 102 may be formed first on the substrate 100 in the high voltage region HV, and the depth of the lightly-doped drain region 102 is deeper than the subsequent formation of the shallow trench isolation structure. Then, a first mask layer 200 is formed on the substrate 100, where the first mask layer 200 includes a silicon nitride layer 202 and a silicon dioxide layer 204. According to this embodiment, the sequence of forming the first mask layer 200 is to form the silicon dioxide layer 204 first, followed by forming the silicon nitride layer 202 on the silicon dioxide layer 204.

Figure 3:
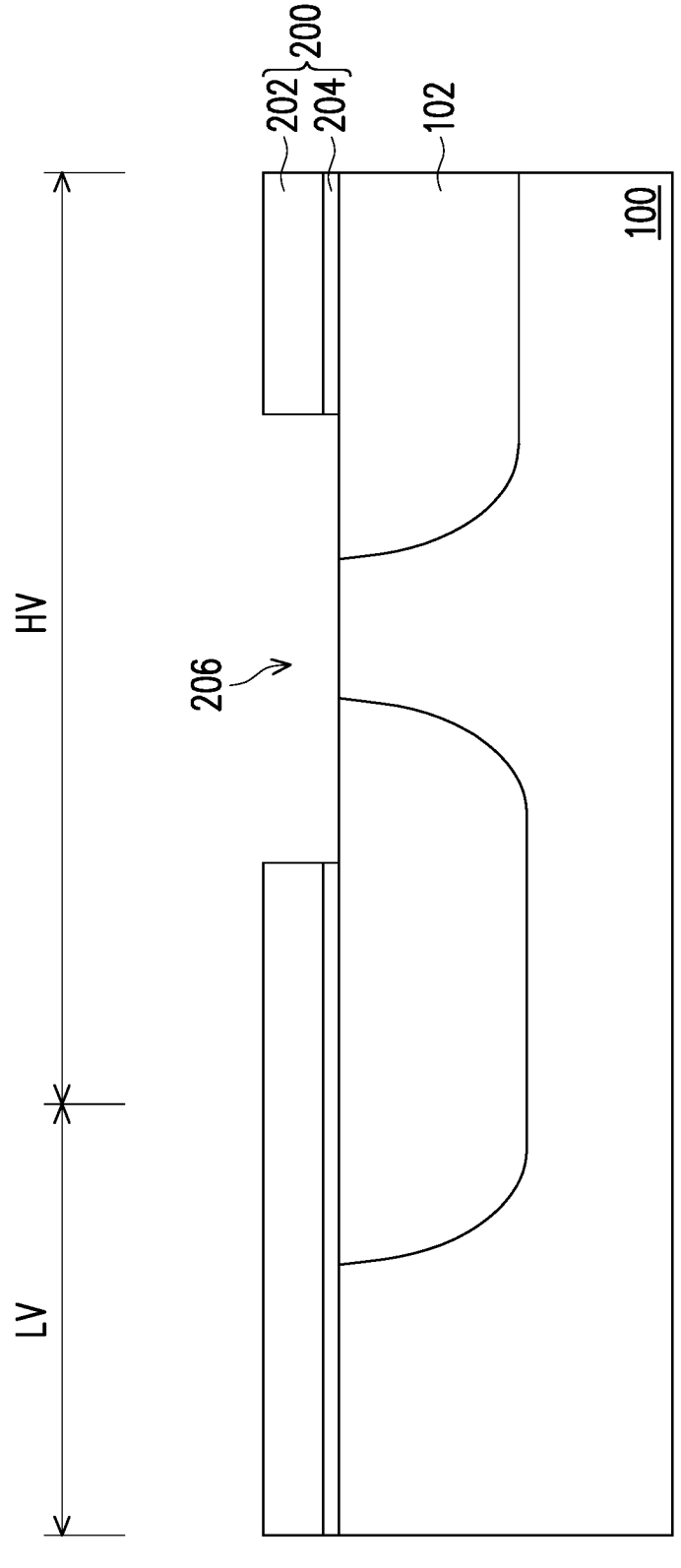

Next, referring to FIG. 3, the first mask layer 200 is patterned to form an opening 206 and expose a portion of the substrate 100. The step of patterning the first mask layer 200 is that, for example, a patterned photoresist (not shown) is firstly formed on the first mask layer 200, and the photoresist is used as a mask to etch the silicon nitride layer 202 to transfer the pattern to the first mask layer 200. The patterned silicon nitride layer 202 is then used as a mask to etch the silicon dioxide layer 204. According to this embodiment, the opening 206 is located in the high voltage region HV of the substrate 100, and the exposed substrate 100 on both sides of the opening 206 includes different lightly-doped drain regions 102; however, the disclosure is not limited thereto.

Figure 4:
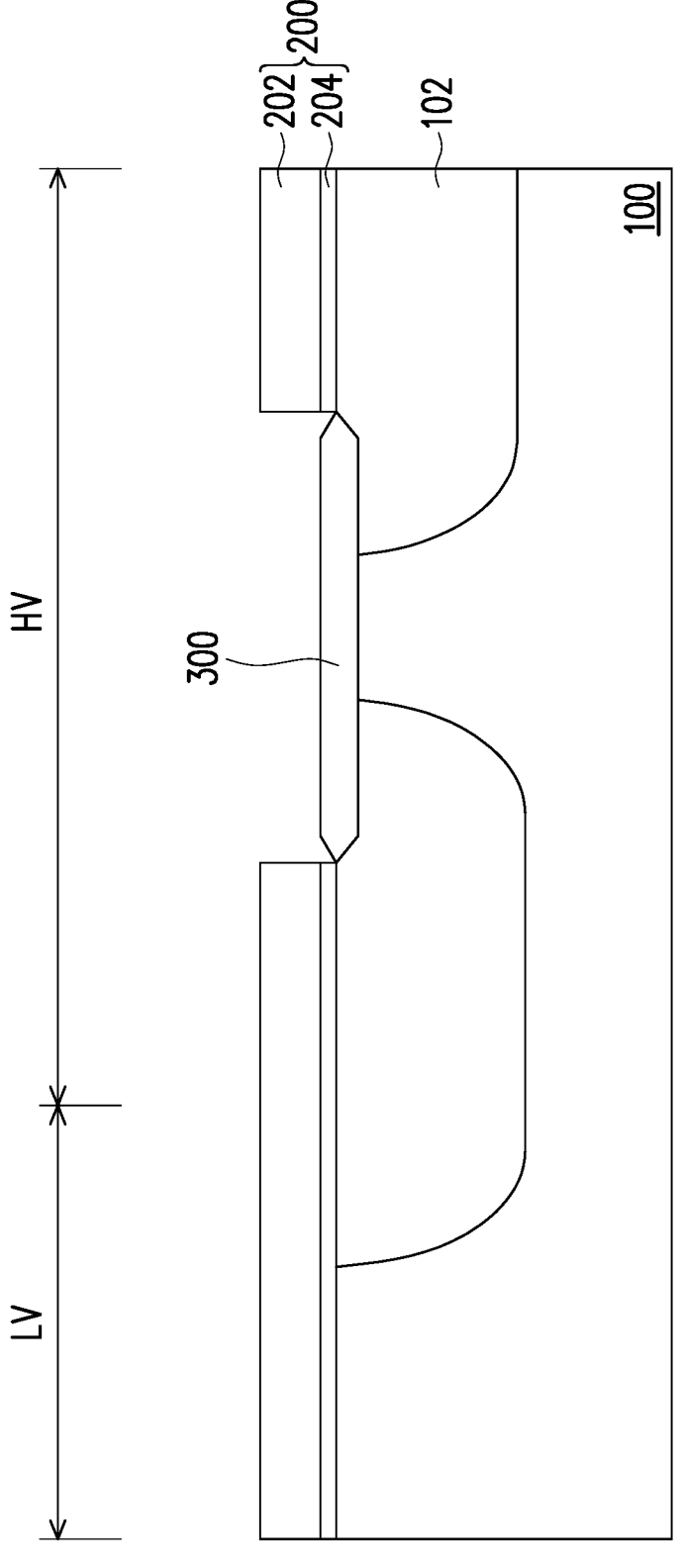

Next, referring to FIG. 4, the substrate 100 exposed by the opening 206 is partially oxidized, so that the exposed substrate 100 forms a gate oxide layer 300. According to this embodiment, a thickness of the gate oxide layer 300 formed is, for example, between 1500 Å and 2000 Å, but the disclosure is not limited thereto.

Figure 5:
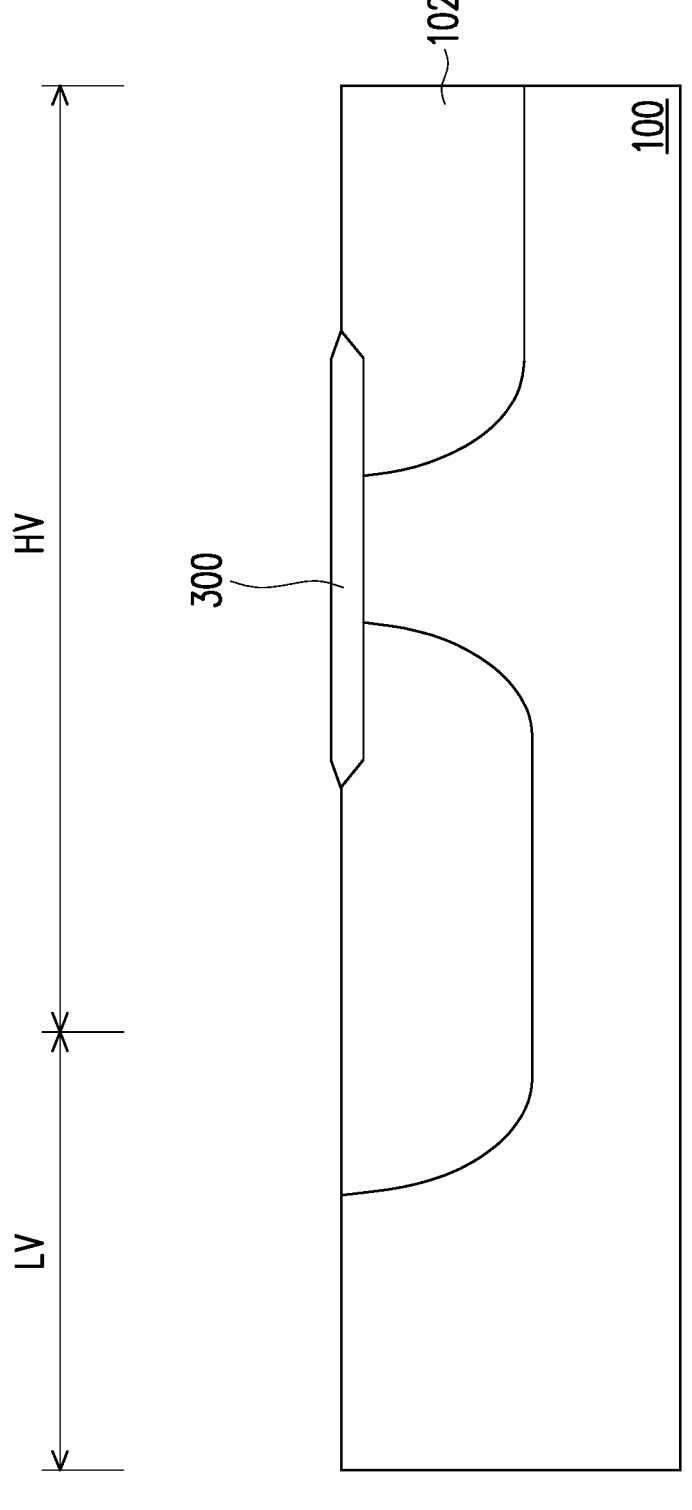

Next, referring to FIG. 5, the first mask layer 200 of FIG. 4 is removed. Then, in order to make an upper surface of the gate oxide layer 300 in the high voltage region HV and an upper surface of the gate dielectric layer subsequently formed in the low voltage region LV coplanar, wet etching of the gate oxide layer 300 is required to reduce the thickness of the gate oxide layer 300. For example, the thickness of the gate oxide layer 300 may be determined by controlling the length of etching time. On the one hand, a longer etching time may remove more gate oxide layer 300, so the thickness of gate oxide layer 300 will be thinner; on the other hand, a shorter etching time removes less gate oxide layer 300, so the thickness of gate oxide layer 300 will not become too thin.

Figure 6:
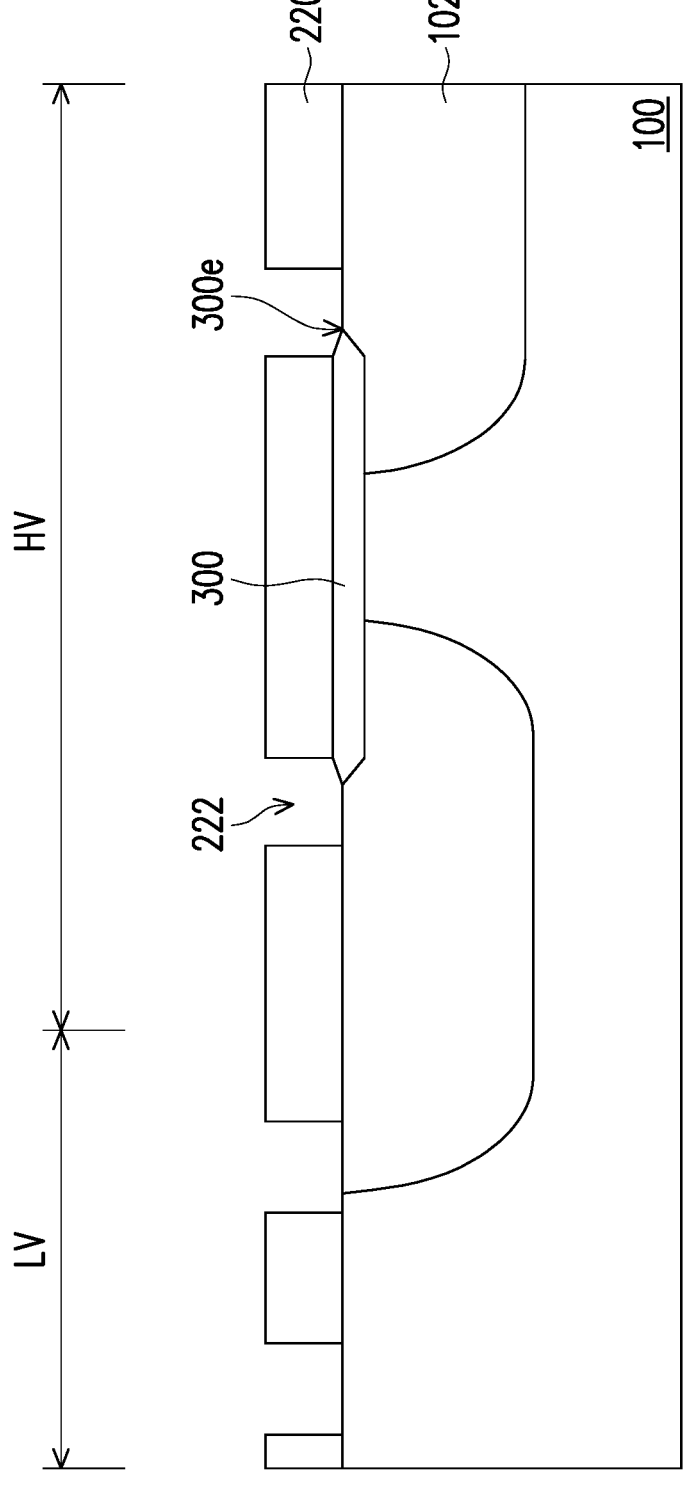

Next, referring to FIG. 6, in order to form the shallow trench isolation structure in the substrate 100, a second mask layer 220 may be formed on the substrate 100 and the gate oxide layer 300 first. According to this embodiment, the method for forming the second mask layer 220 is that, for example, a liner oxide layer (not shown) and a silicon nitride layer (not shown) are sequentially formed on the gate oxide layer 300, a patterned photoresist (not shown) is formed on the second mask layer 220, the photoresist is used as a mask to etch the silicon nitride layer (not shown) to transfer the pattern to the silicon nitride layer, and then the patterned silicon nitride layer is used as a mask to etch the liner oxide layer (not shown). The patterned second mask layer 220 has plural openings 222. The openings 222 are distributed in the high voltage region HV and the low voltage region LV, and expose a portion of the substrate 100 and an edge 300e of the gate oxide layer 300.

Figure 7:
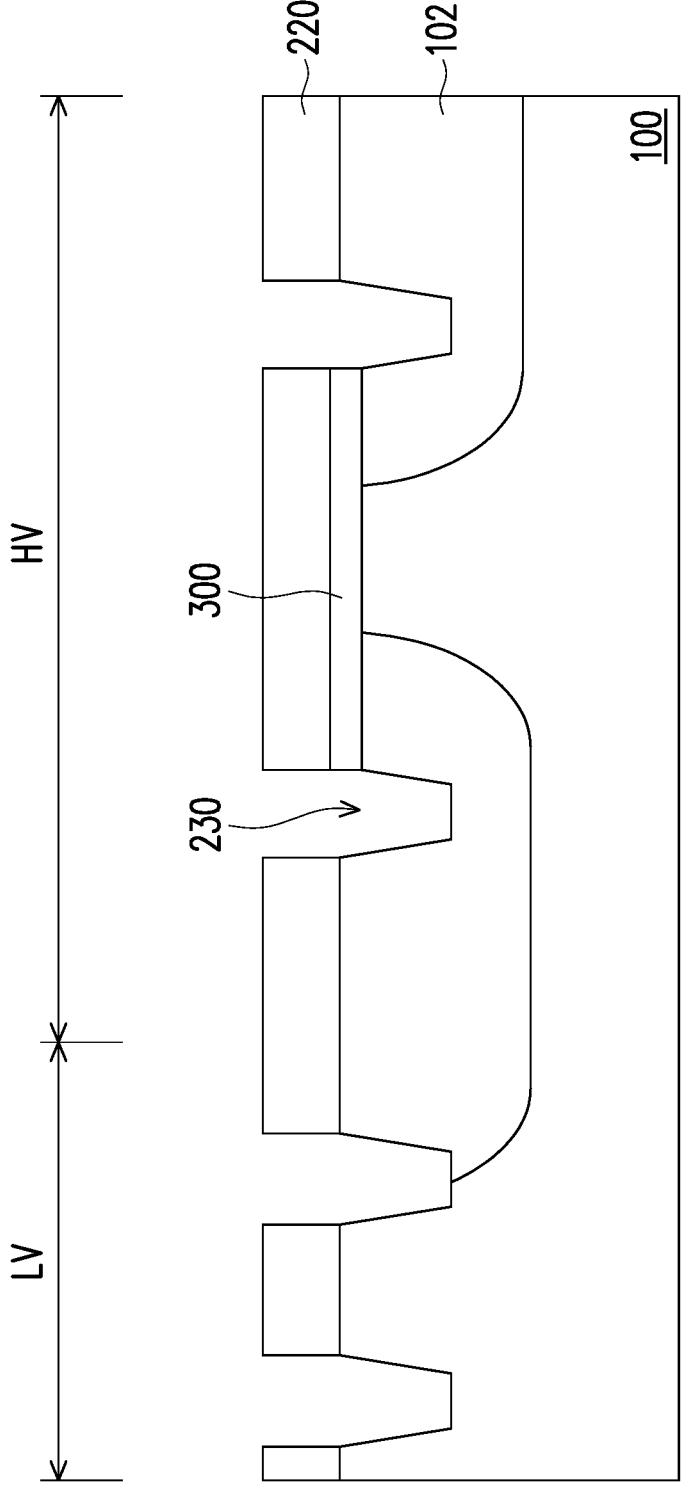

Next, referring to FIG. 7, the second mask layer 220 is used as a mask, dry etching is performed to form multiple trenches 230 surrounding the high voltage region HV in the substrate 100, and then the patterned photoresist (not shown) on the second mask layer 220 is removed. The process of forming the trenches 230 removes the edge of the gate oxide layer 300 (the edge 300e in FIG. 6) at the same time. Since the edge of the gate oxide layer 300 (the edge 300e in FIG. 6) has a bird's beak phenomenon, which causes the thickness of the gate oxide layer 300 to vary, removing the edge of the gate oxide layer 300 allows the thickness of the gate oxide layer 300 to be uniform, and avoids a time dependent dielectric breakdown (TDDB) phenomenon in the high voltage region HV. According to this embodiment, the trenches 230 are also located in the low voltage region LV, serving as element isolation structures of the low voltage region LV.

Figure 8:
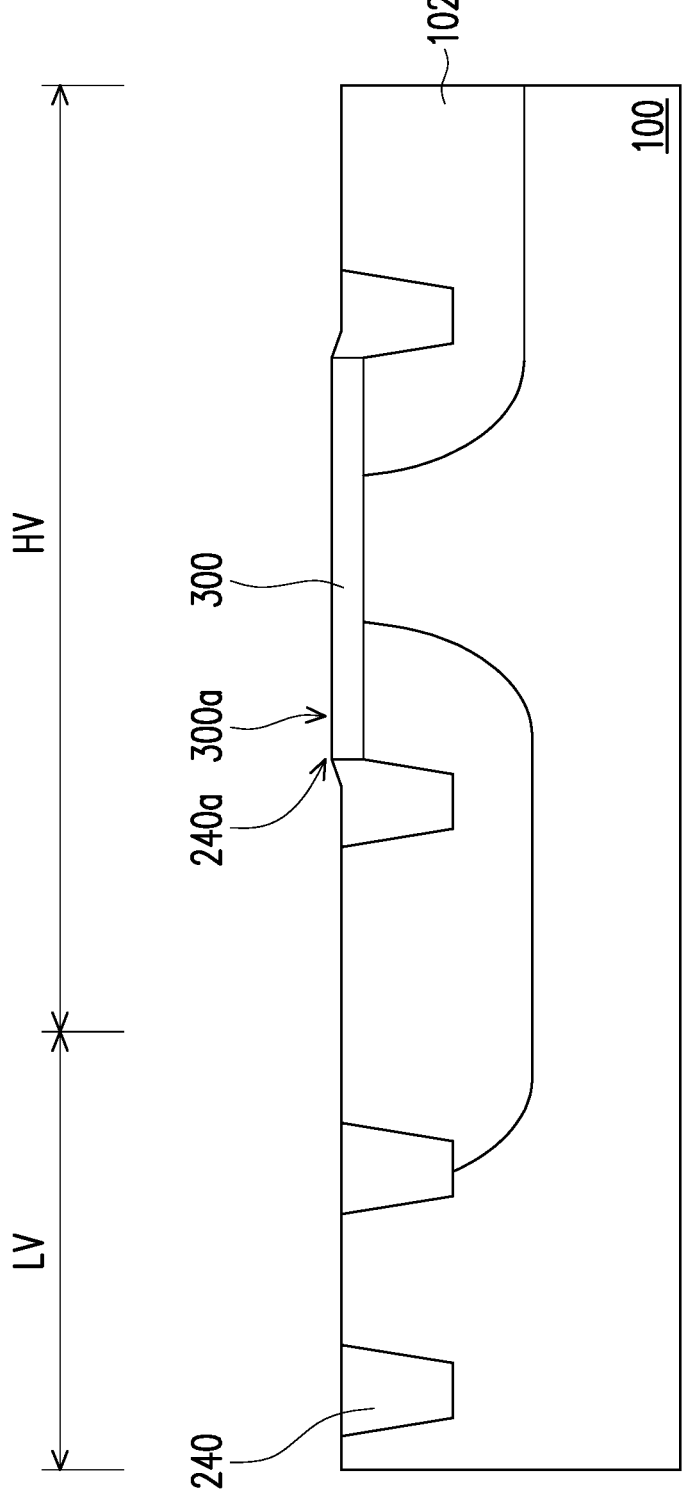

Next, referring to FIG. 8, an insulating material (not shown) is filled in the trench 230 by means of, for example, high-density plasma chemical vapor deposition, and the insulating material may be planarized by a chemical mechanical planarization process to form plural shallow trench isolation structures 240, and then the second mask layer 220 is removed.

Figure 9:
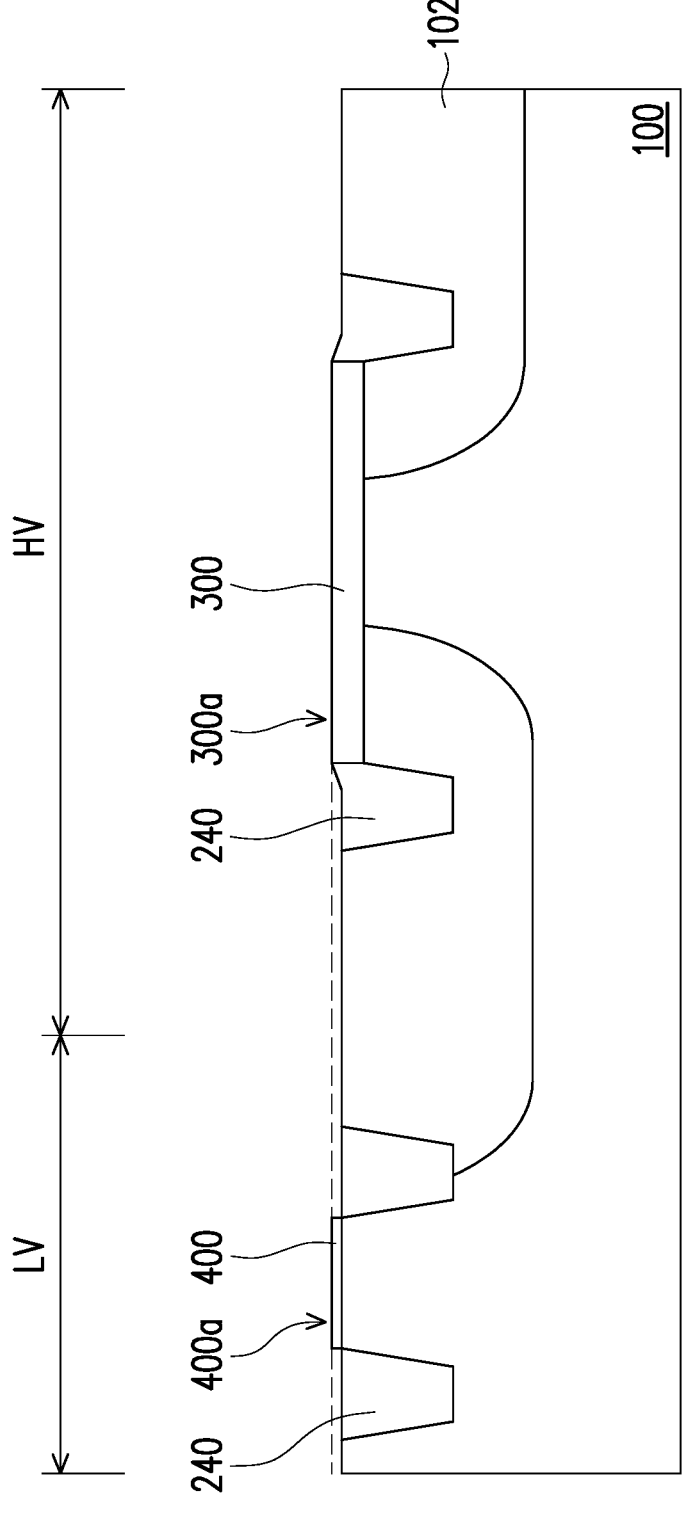

Next, referring to FIG. 9, a gate dielectric layer 400 is formed in the low voltage region LV on the substrate 100. An upper surface 400a of the gate dielectric layer 400 is coplanar with the upper surface 300a of the gate oxide layer 300 (such as the plane indicated by the dashed line), which may avoid the error of the height of the metal gate formed later. According to this embodiment, the method for forming the gate dielectric layer 400 is, for example, chemical vapor deposition (CVD) with a high dielectric constant material, as described in the previous embodiment, and therefore will not be repeated.

Figure 10:
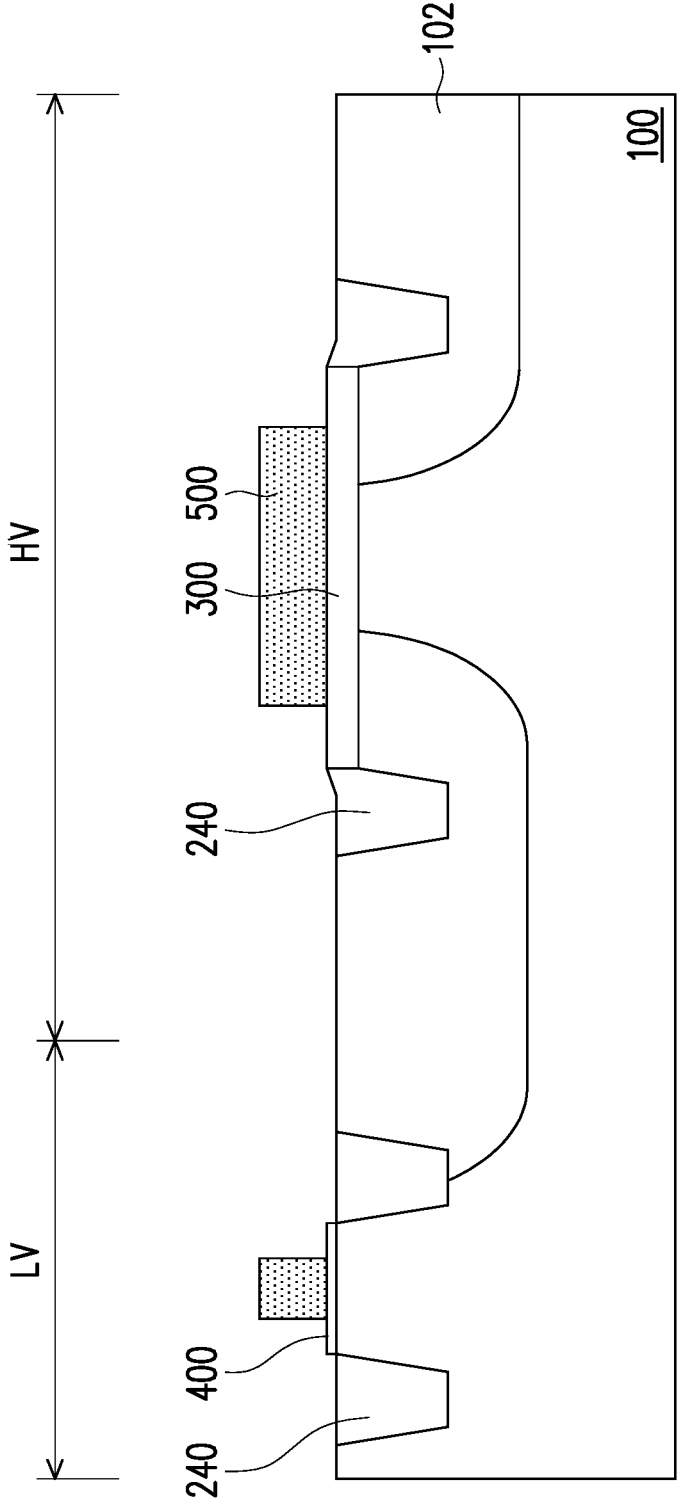

Next, referring to FIG. 10, in order to form a metal gate, a sacrificial gate layer 500 may be formed at a predetermined position of the upper surface 300a of the gate oxide layer 300 and a predetermined position of the upper surface 400a of the gate dielectric layer 400, respectively. According to one embodiment, the gate sacrificial layer 500 is formed, for example, by first depositing a polysilicon layer (not shown) to fully cover the substrate 100, the shallow trench isolation structure 240, the gate oxide layer 300, and the gate dielectric layer 400, then forming a patterned photoresist (not shown) on the polysilicon layer, and etching the polysilicon layer with the photoresist as a mask to obtain the gate sacrificial layer 500.

Figure 11:
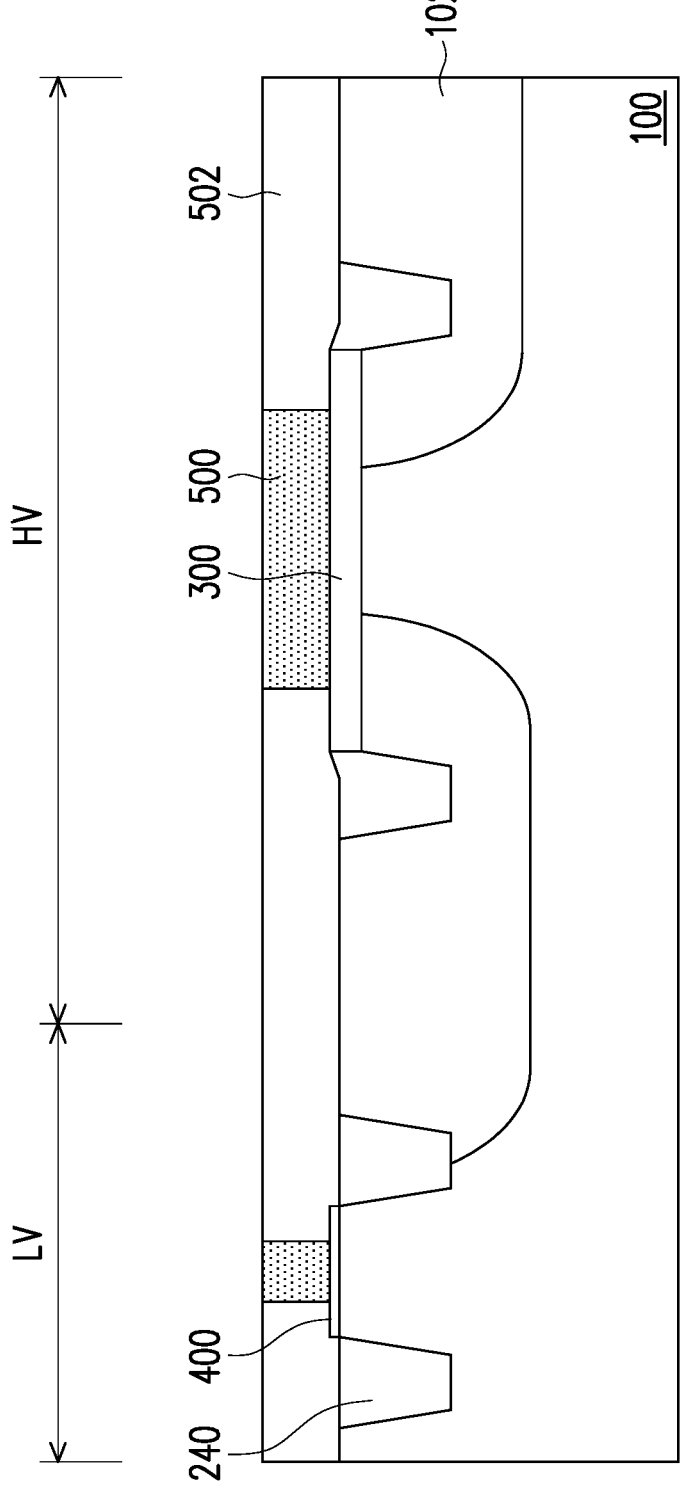

Next, referring to FIG. 11, a dielectric layer 502 is formed on the substrate 100 to cover the sacrificial gate layer 500, and a first chemical mechanical planarization process is performed until the sacrificial gate layer 500 is exposed.

Figure 12:
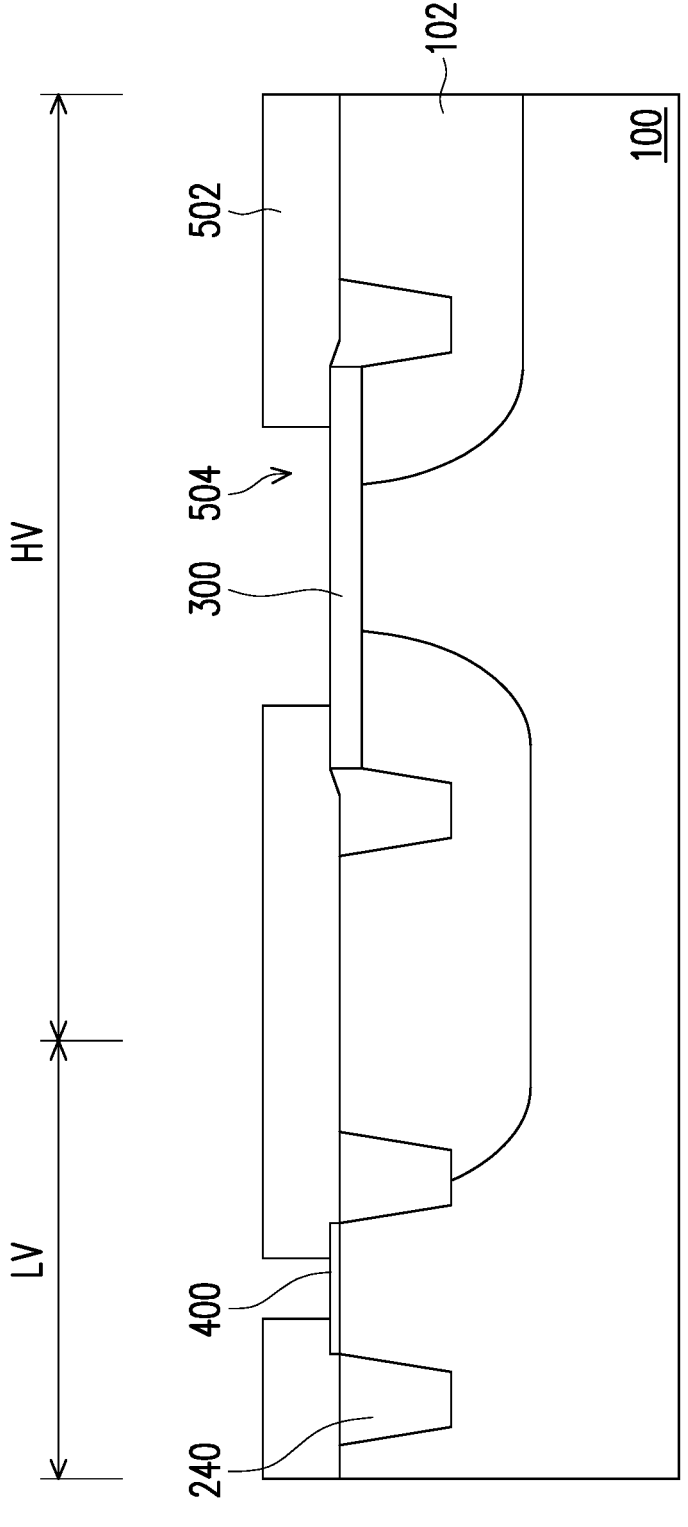

Next, referring to FIG. 12, the sacrificial gate layer 500 is removed to obtain an opening 504 exposing the predetermined position.

Figure 13:
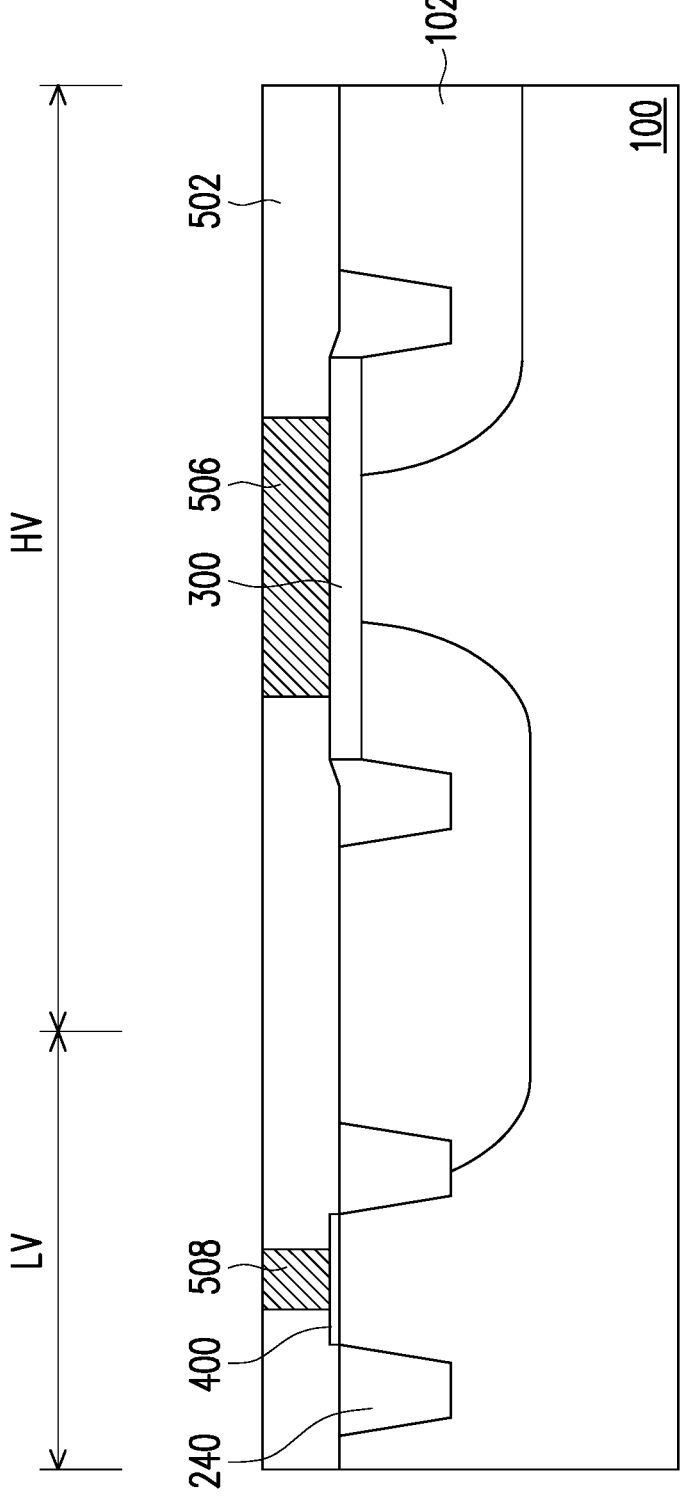

Next, referring to FIG. 13, a metal layer is formed on the substrate 100 to fill a predetermined position (the opening 504) in the dielectric layer 502, and a second chemical mechanical planarization process is performed on the metal layer to form the first metal gate layer 506 and the second metal gate layer 508.

To sum up, according to the method of manufacturing the semiconductor device of the disclosure, the gate oxide layer is first completed and its thickness is slightly reduced, and then the shallow trench isolation structure is formed. Since the formation of the shallow trench isolation structure requires etching the trench in the substrate first, the edges of the gate oxide layer with different thicknesses may be removed together by the etching process, so that the overall thickness of the retained gate oxide layer is uniform to avoid the time dependent dielectric breakdown (TDDB) phenomenon. In addition, according to the method of manufacturing of the disclosure, the gate oxide layer in the high voltage region and the gate dielectric layer in the low voltage region may have approximately equal upper surfaces to ensure that the thickness of the metal gate layers in the high voltage region and the low voltage region are the same, thus improving the stability of the semiconductor device.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. A method of manufacturing a semiconductor device, comprising:

forming a gate oxide layer on a substrate, wherein the substrate comprises a high voltage region and a low voltage region, and the gate oxide layer is disposed in the high voltage region;

performing wet etching on the gate oxide layer to reduce a thickness of the gate oxide layer;

forming a plurality of trenches around the high voltage region in the substrate, wherein forming the trenches comprises removing an edge of the gate oxide layer to make the thickness of the gate oxide layer uniform;

filling an insulating material into the trenches to form a plurality of shallow trench isolation structures, wherein an upper surface of the shallow trench isolation structures close to the edge of the gate oxide layer is at the same vertical height of an upper surface of the gate oxide layer, a height of the plurality of shallow trench isolation structures surrounding the gate oxide layer on a side close to the gate oxide layer is greater than a height of a side away from the gate oxide layer; and forming a gate dielectric layer in the low voltage region on the substrate, wherein an upper surface of the gate dielectric layer is at the same vertical height of the upper surface of the gate oxide layer in the high voltage region.

2. The method of manufacturing the semiconductor device according to claim 1, wherein forming the gate oxide layer comprises:

forming a first mask layer on the substrate;

patterning the first mask layer to expose a portion of the substrate;

partially oxidizing the portion of the substrate to form the gate oxide layer; and removing the first mask layer.

3. The method of manufacturing the semiconductor device according to claim 2, wherein forming the first mask layer comprises:

forming a silicon dioxide layer on the substrate; and forming a silicon nitride layer on the silicon dioxide layer.

4. The method of manufacturing the semiconductor device according to claim 1, wherein forming the trenches comprises:

forming a second mask layer on the substrate and the gate oxide layer;

patterning the second mask layer to expose a portion of the substrate and the edge of the gate oxide layer; and performing dry etching to form the trenches.

5. The method of manufacturing the semiconductor device according to claim 1, wherein after filling the insulating material further comprises: performing a chemical mechanical planarization process on the insulating material after the insulating material is filled.

6. The method of manufacturing the semiconductor device according to claim 1, further comprising:

respectively forming a first metal gate layer and a second metal gate layer on the upper surface of the gate oxide layer and the upper surface of the gate dielectric layer.

7. The method of manufacturing the semiconductor device according to claim 6, wherein forming the first metal gate layer and the second metal gate layer comprises:

forming a sacrificial gate layer at a predetermined position of the gate oxide layer and the gate dielectric layer;

forming a dielectric layer on the substrate to cover the sacrificial gate layer;

performing a first chemical mechanical planarization process on the dielectric layer until the sacrificial gate layer is exposed;

removing the sacrificial gate layer;

forming a metal layer on the substrate to fill the predetermined position within the dielectric layer; and performing a second chemical mechanical planarization process on the metal layer to form the first metal gate layer and the second metal gate layer.

* * * * *